United States Patent
Schwan (10) Patent No.: US 7,064,071 B2
(45) Date of Patent: Jun. 20, 2006

(54) METHOD OF FORMING A CONFORMAL SPACER ADJACENT TO A GATE ELECTRODE STRUCTURE

(75) Inventor: Christoph Schwan, Gebhardshain (DE)

(73) Assignee: Advanced Micro Devices, Inc., Austin, TX (US)

( * ) Notice: Subject to any disclaimer, the term of this patent is extended or adjusted under 35 U.S.C. 154(b) by 129 days.

(21) Appl. No.: 10/813,317

(22) Filed: Mar. 30, 2004

(65) Prior Publication Data

US 2005/0048753 A1    Mar. 3, 2005

(30) Foreign Application Priority Data

Aug. 29, 2003 (DE) ................. 103 39 989

(51) Int. Cl.
*H01L 21/311* (2006.01)
*H01L 21/336* (2006.01)

(52) U.S. Cl. ............... 438/696; 438/303; 438/595

(58) Field of Classification Search ........... 438/696, 438/305, 303, 306, 307
See application file for complete search history.

(56) References Cited

U.S. PATENT DOCUMENTS

| 5,573,965 | A  | * | 11/1996 | Chen et al. ................. 438/297 |
| 6,534,388 | B1 | * | 3/2003  | Lin et al. .................... 438/510 |
| 6,551,887 | B1 | * | 4/2003  | Kwon et al. ................ 438/305 |
| 6,706,605 | B1 | * | 3/2004  | Ekbote et al. .............. 438/305 |
| 2002/0182795 | A1 |  | 12/2002 | Bae et al. .................. 438/200 |

\* cited by examiner

*Primary Examiner*—Michael Trinh
(74) *Attorney, Agent, or Firm*—Williams, Morgan & Amerson, P.C.

(57) ABSTRACT

In a process for forming L-shaped sidewall spacers for a conducive line element, such as a gate electrode structure, the sacrificial spacers are formed of a material having a similar etch behavior as the material of the finally obtained L-shaped spacer, thereby improving tool utilization and reducing process complexity compared to conventional processes. In one particular embodiment, a spacer layer stack is provided having a first etch stop layer, a first spacer layer, a second etch stop layer, and a second spacer layer, wherein the first and second spacer layers are comprised of silicon nitride.

32 Claims, 4 Drawing Sheets

METHOD OF FORMING A CONFORMAL SPACER ADJACENT TO A GATE ELECTRODE STRUCTURE

BACKGROUND OF THE INVENTION

1. Field of the Invention

Generally, the present invention relates to the formation of integrated circuits, and, more particularly, to the formation of highly conformal spacer elements, also referred to as L-shaped spacers, during the manufacturing of conductive lines, such as a gate electrode of a field effect transistor.

2. Description of the Related Art

In modern integrated circuits, minimum feature sizes, such as the channel length of field effect transistors, have reached the deep sub-micron range, thereby steadily increasing performance of these circuits in terms of speed and power consumption. Typically, the gate electrode of a field effect transistor may be considered as a conductive line, which is comprised in standard CMOS technology of highly doped polysilicon including a metal silicide region, wherein the lateral extension of the conductive line substantially determines the length of a conductive channel being formed in a silicon region under a gate insulation layer that separates the gate electrode and the silicon region. This channel region connects highly doped drain and source regions, the dopant profile of which is typically generated by complex ion implantation sequences in which the gate electrode acts as an implantation mask. As the dimensions of a field effect transistor decrease, typically the channel length, i.e., the lateral extension of the gate electrode, has to be decreased in combination with a thickness of the gate insulation layer so as to maintain a required degree of controllability of the conductive channel forming in the channel region upon application of an appropriate control voltage to the gate electrode. In addition, precisely controlled dopant profiles in the lateral and the vertical direction are required so as to reduce adverse effects, such as hot carrier effects and short channel effects, that may increasingly occur when the dopant profile is not adequately adapted to the overall transistor dimensions.

Commonly, the lateral dopant profile is adjusted by providing an implantation mask, wherein the material composition and layer thickness in combination with the lateral dimensions of the mask enable the creation of a specified lateral dopant profile during a specifically designed implantation process. That is, process parameters of the implantation process, i.e., the type of dopants used, the particle energy, tilt angle, and the like, are selected on the basis of the characteristics of the implantation mask so as to achieve the required dopant profile. Therefore, it has become standard practice in conventional CMOS technologies to provide sidewall spacers adjacent to the gate electrode, wherein a lateral width of the sidewall spacers allows a precise control of the lateral blocking effect during an implantation sequence. Although a plurality of materials are typically used for the sidewall spacers, it turns out that, for extremely scaled transistor devices, silicon nitride is a preferred candidate since it may be deposited by well-established plasma enhanced chemical vapor deposition (PECVD) techniques in a highly conformal manner, wherein a thickness of the silicon nitride layer of this order of magnitude may suppress boron diffusion more efficiently compared to a oxide layer. The sidewall spacer formation process is a self-aligned technique in which the silicon nitride layer is conformally deposited over the substrate including the gate electrode structure and is subsequently anisotropically etched back to leave behind the spacer elements on the sidewalls of the gate electrode, whereas other substrate regions are substantially cleared of silicon nitride. Since an etch chemistry for anisotropically etching silicon nitride is typically based on hydrogenated carbon fluorides, exposure of non-protected silicon surfaces, such as a top surface of the polysilicon gate electrode and the crystalline silicon of the substrate, would lead to a significant etching of these exposed silicon areas. Consequently, a thin liner oxide is typically formed, for instance, by oxidation or deposition, prior to the formation of the silicon nitride layer, wherein the anisotropic etch chemistry used for removing the silicon nitride layer exhibits an excellent selectivity to silicon dioxide, thereby substantially avoiding undue material removal of the underlying silicon areas. The silicon dioxide may also be used during subsequent implantation processes to reduce channeling effects. In other process flows, the thin silicon dioxide layer may be removed by a so-called "breakthrough" step using, for instance, a hydrogenated fluorine (HF) wet etch. Since the formation of silicon nitride sidewall spacers has become a standard technique in the manufacturing of advanced CMOS devices, highly efficient anisotropic etch recipes have been developed that provide a high silicon nitride etch rate. Moreover, the process recipes may be optimized in terms of required process gases and tool utilization so that a minimum number of different reactive gases are required in a single etch tool for performing the silicon nitride etch.

Although the above-described sidewall spacer technique is very efficient in the fabrication of CMOS devices having a gate length well beyond 0.2 μm, it turns out that for smaller feature sizes the formation of relatively bulky sidewall spacers may be disadvantageous in view of thermal stress exerted to the gate electrode and caused by the formation of the sidewall spacers. Additionally, bulky sidewall spacers may not provide the required flexibility in designing the lateral dopant profile of the drain and source regions and the corresponding extension regions connecting to the channel region. For this reason, highly conformal spacer elements, so-called L-shaped spacers, have been proposed to at least partially reduce stress effects in the gate electrode while providing an increased variability of subsequent implantation processes. In other process schemes, bulky spacers are still used for the implantation, while L-shaped spacers are then formed after removal of the bulky spacers to avoid undesired implantation through the foot of the L-shaped spacer, so as to enable more efficient exposure of the upper portion of the gate electrode prior to the silicidation.

Figure 1A:
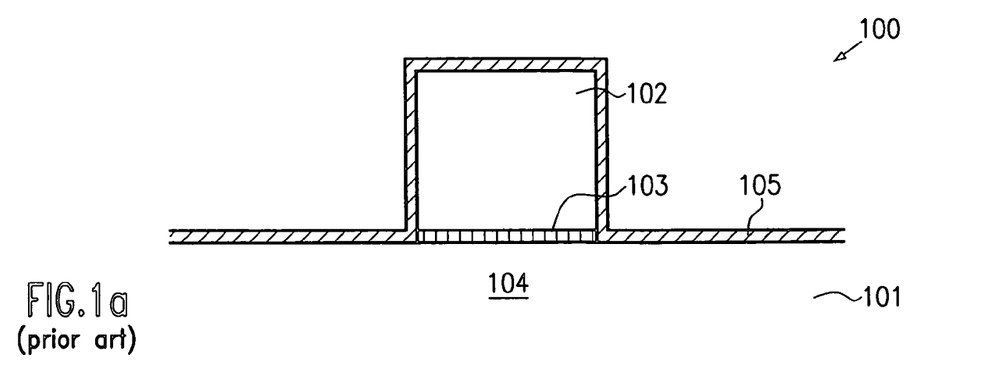
FIGS. 1a–1d schematically show cross-sectional views of a gate structure for a field effect transistor during the manufacturing sequence for forming L-shaped spacer elements according to a typical conventional process flow.

With reference to FIGS. 1a–1d, a typical conventional process flow for forming L-shaped sidewall spacers will now be described in more detail. In FIG. 1a, a field effect transistor 100, shown in an early manufacturing stage, comprises a substrate 101 including a silicon region in which drain and source regions are to be formed adjacent to a channel region 104. A gate electrode 102, typically comprised of polysilicon, is formed above the channel region 104 and is separated therefrom by a gate insulation layer 103, which may be comprised, for instance, of silicon dioxide. Moreover, a liner oxide 105 is formed on the substrate 101 and on the gate electrode 102. It should be noted that, for convenience, isolation structures in the form of trench isolations or localized oxidized substrate portions as well as any offset spacers are not shown.

A typical process flow for forming the transistor 100 as shown in FIG. 1a may comprise the following processes. After formation of isolation structures (not shown), a vertical dopant profile may be formed within the substrate 101 and especially within the channel region 104 by well-established implantation sequences. Thereafter, a gate electrode layer stack is formed on the substrate 101, wherein the gate electrode layer stack comprises a gate dielectric and formed thereon a polysilicon layer of appropriate thickness. The gate dielectric may be comprised of any appropriate material with a required thickness and may, for instance, be comprised of silicon dioxide with a thickness of approximately 2–3 nm or less for advanced transistor devices. The gate dielectric may be formed, when comprised of silicon dioxide, by advanced oxidation and/or growth techniques. Subsequently the polysilicon layer may be deposited by well-established low pressure CVD methods. Then, a resist mask (not shown), possibly including a bottom anti-reflective coating, is formed on the polysilicon layer by means of advanced photolithography, wherein an anisotropic etch process is then performed so as to pattern the gate electrode 102. The gate dielectric, acting as an etch stop layer during the patterning of the gate electrode 102, may be patterned by a corresponding HF-based clean process, in which etch passivant layers are removed, thereby removing exposed portions of the gate dielectric so as to form the gate insulation layer 103. The liner oxide 105 may be formed by oxidation and/or deposition techniques such as plasma enhanced CVD. Typically, a thickness of the liner oxide 105 may be in the range of approximately 3–15 nm.

Figure 1B:
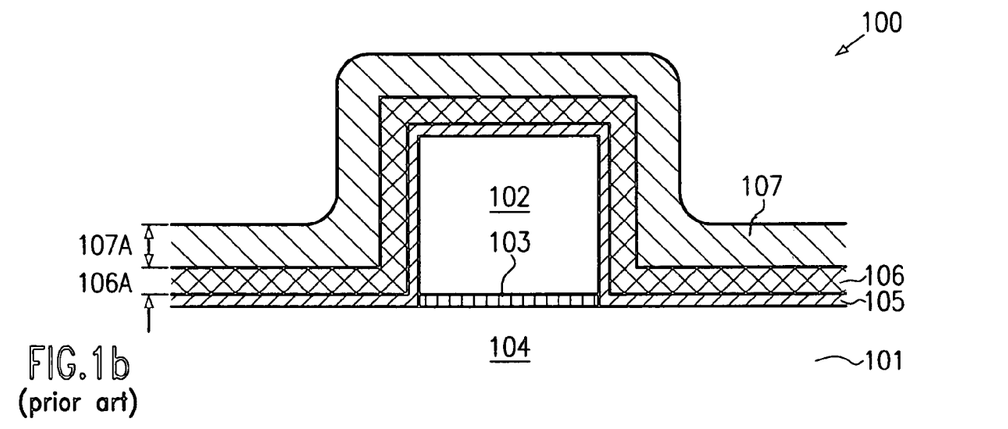

FIG. 1b schematically shows the transistor 100 in an advanced manufacturing stage. The transistor 100 comprises a conformal silicon nitride layer 106 having a thickness indicated by 106a. As will be shown later, the thickness 106a of the silicon nitride layer substantially defines a thickness of the conformal, i.e., L-shaped, spacers to be formed. A second spacer layer 107 is conformally formed on the silicon nitride layer 106 and has a thickness 107a that substantially determines a length of the conformal spacers, as will be explained later on.

The silicon nitride layer 106 may be formed by a low temperature plasma enhanced CVD process, wherein the physical characteristics of the layer 106 may be adjusted by correspondingly selecting the deposition process parameters. As previously noted, silicon nitride and any processes for depositing the same are highly approved in the formation of conventional bulky sidewall spacers so that conformity and layer thickness of the layer 106, as well as the characteristics of the material composition, may be well controlled so as to provide the required spacer characteristics. Thereafter, the spacer layer 107 is deposited, wherein frequently organic materials, amorphous silicon, or silicon dioxide are used as preferred materials. Depending on the type of material used, an appropriate deposition technique is selected so as to form the layer 107 having the required thickness 107a. Although the spacer layer 107 is shown in the form of a relatively conformal layer which may be appropriate for silicon or silicon dioxide, in other examples the layer 107 may be provided as an organic material that is applied by spin-on techniques, wherein, depending on the degree of viscosity of the organic material, a thickness of the layer 107 on top of the gate electrode 102 may significantly differ from the thickness 107a.

Figure 1C:
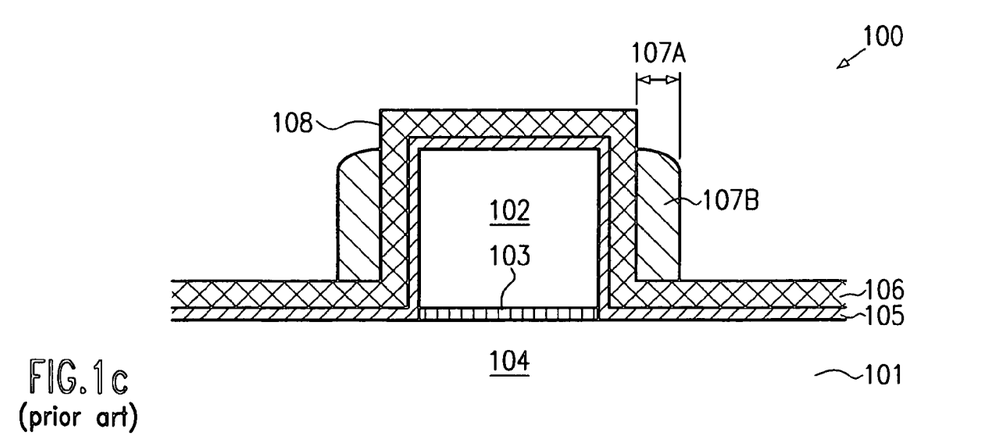

FIG. 1c schematically shows the transistor 100 with substantial portions of the spacer layer 107 being removed, thereby forming sacrificial sidewall spacers 107b. If the spacer layer 107 is comprised of, for instance, silicon dioxide, a correspondingly designed anisotropic etch process may be performed so as to substantially completely remove horizontal layer portions of the layer 107 while only slightly attacking the silicon nitride layer 106. To this end, an anisotropic etch process on the basis of carbon and fluoride may be performed, wherein the achieved etch selectivity to the underlying silicon nitride layer 106 and/or the available thickness 106a thereof substantially determine an allowable over-etch time for exposing upper sidewall portions 108 of the silicon nitride layer 106. As previously explained, the initial thickness 107a substantially determines the lateral extension of the sidewall spacer 107b when the spacer layer 107 has been deposited in a substantially conformal manner. If the sacrificial sidewall spacer 107b is formed on the basis of the spacer layer 107 being deposited in a non-conformal manner, for instance by spin-on techniques, the resulting width of the spacer 107b may be adjusted by the specifics of the etch process for removing the excess material of the spacer layer 107. The corresponding behavior of the etch process may be determined in advance so that the resulting width of the sacrificial spacer 107b may be achieved with a required precision irrespective of the degree of conformity of the initial spacer layer 107.

At any rate, a specific etch process has to be performed so as to obtain the sacrificial spacer 107b having the desired width. Consequently, additional reactive gases or other precursors required for the appropriate etch chemistry have to be provided in combination with a suitable etch tool, thereby contributing to process complexity. Thereafter, exposed portions of the silicon nitride layer 106 may be removed by a well-established anisotropic etch step using an etch chemistry similar to that used in conventional processes for manufacturing bulky silicon nitride sidewall spacers, wherein the etch process is reliably stopped within the liner oxide 105. Next, the sacrificial spacers 107b may be removed by a correspondingly designed etch process wherein, depending on the material composition of the sacrificial spacer 107b, exposed portions of the silicon oxide liner 105 may be removed prior to, during, or after the removal of the sacrificial spacers 107b. For instance, if the sacrificial spacers 107b are comprised of silicon dioxide, the liner oxide 105 may be removed along with the sacrificial spacers 107b in a common etch process. For instance, a substantially isotropic etch process, such as an HF wet etch process, may be performed that typically exhibits a superior etch selectivity to silicon, compared to an anisotropic etch process, at a reduced degree of damage caused to the underlying silicon areas owing to the substantial absence of high energetic ionized particles directed to the substrate surface.

Figure 1D:
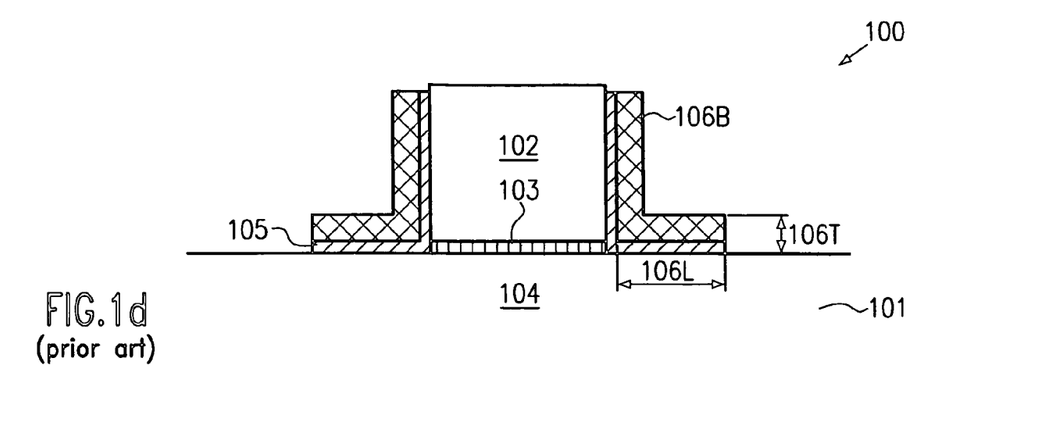

FIG. 1d schematically shows the transistor 100 after removal of the sacrificial spacers 107b and exposed portions of the oxide liner 105, wherein, for convenience, any undercut regions at the upper sidewall portions 108 and at the foot of the resulting L-shaped spacers, indicated as 106b, are not shown. As is evident from FIG. 1d, the conformal spacer or L-shaped spacer 106b exhibits a spacer length, denoted as 106l, which is substantially determined by the width of the sacrificial spacer 107b (see FIG. 1c) and by the initial layer thickness of the silicon nitride layer 106. Moreover, a thickness of the L-shaped spacer 106b, denoted as 106t, is substantially determined by the initial layer thickness 106a of the silicon nitride layer 106. Moreover, as may be seen from the drawing, the initial thickness of the liner oxide 105 may contribute to the spacer length 106l as well as to the spacer thickness 106t.

In a subsequent implantation sequence, an efficient lateral dopant profiling may occur, wherein the resulting dopant profile may be controlled, in addition to appropriately selecting the implantation parameters, by the spacer length 106l and the spacer thickness 106t, wherein, additionally, the reduced material amount of the L-shaped spacer 106b may provide superior stress-induced effects on the gate electrode 102.

Although the L-shaped spacer 106b may provide an improved lateral dopant profiling in combination with reduced stress-induced effects, a complex etch sequence is required for forming and removing the sacrificial spacers 107b, thereby resulting in the introduction of additional reactive gases and/or the establishment of new etch recipes and/or the requirement for additional etch tools. For instance, the sacrificial spacers 107b require an oxide etch process that stops on nitride, while a subsequent nitride spacer etch relies on the etching of nitride with oxide as etch stop layer. Due to etch gas residues from the previous step or different tool hardware requirements for the different etch processes, typically two different etch chambers may be needed. In view of these drawbacks, a need exists for a manufacturing technique that enables the formation of L-shaped spacers without unduly contributing to process complexity.

SUMMARY OF THE INVENTION

Generally, the present invention is directed to a technique for forming conformal sidewall spacers during the fabrication of conductive lines, such as gate electrode structures of field effect transistors, wherein the removal of sacrificial spacers may be accomplished by etch recipes that are also used for the definition of the conformal sidewall spacers. To this end, the sacrificial spacer and the conformal spacer may be formed from a material that may be etched with substantially the same etch chemistry. In one particular embodiment of the present invention, the sacrificial spacer and the conformal spacer may be comprised of silicon nitride with an etch stop layer disposed therebetween.

In a further illustrative embodiment of the present invention, a method of forming spacer elements comprises forming a conductive line above a semiconductor region and conformally forming a spacer layer stack over the conductive line and the semiconductor region. The spacer layer stack comprises an etch stop layer separating a first spacer layer from a second spacer layer that is formed above the first spacer layer, wherein the first and second spacer layers are comprised of a material that may be etched selectively to the etch stop layer by a predefined etch chemistry. Furthermore, the second spacer layer is anisotropically etched so as to form sacrificial sidewall spacers. Portions of the etch stop layer that are exposed during the formation of the sacrificial sidewall spacers are then removed. Finally, the sacrificial sidewall spacers and exposed portions of the first spacer layer are removed by an etch process applying the specified etch chemistry to form the conformal spacer elements.

According to a further illustrative embodiment of the present invention, a method of forming spacer elements comprises forming a conductive line above a semiconductor region and forming a spacer layer stack over the conductive line and the semiconductor region. The spacer layer stack comprises a first etch stop layer formed of a first material, a first spacer layer formed of a second material, a second etch stop layer formed of the first material, and a second spacer layer formed of the second material. Furthermore, a sacrificial spacer is formed at least from the second spacer layer. Finally, conformal spacer elements are formed at least from the first spacer layer by removing the sacrificial spacers.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

As previously discussed, the present invention provides a technique for forming conformal or L-shaped sidewall spacers in which well-established process recipes may be used without necessitating the introduction of new reactive gases and/or requiring the utilization of additional etch tools, thereby providing a high degree of compatibility to the conventional CMOS process flow and reducing process time and cost of ownership compared to conventional processes. In other aspects of the present invention, the process flow may be optimized so as to improve tool utilization in that the total etch process flow may be designed as an in situ process, i.e., the entire etch process for defining the L-shaped spacer may be performed in a single process chamber. In other embodiments, the number of different etch steps during the entire spacer formation process may be maintained at a low level by taking advantage of the fact that the sacrificial spacers and the L-shaped spacer material may exhibit a similar etch behavior, thereby significantly reducing process time and improving tool utilization even if new process recipes have to be established.

Figure 2A:
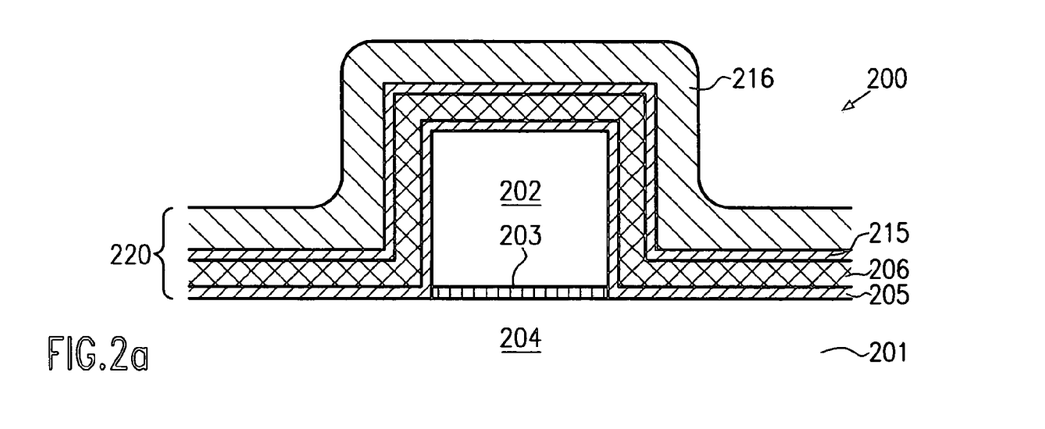
FIGS. 2a–2e schematically show cross-sectional views of a conductive line, such as a gate structure, during various stages of fabricating conformal sidewall spacers according to illustrative embodiments of the present invention.

With reference to FIGS. 2a–2h, further illustrative embodiments of the present invention will now be described in more detail. In FIG. 2a, a semiconductor device 200 comprises a conductive line element 202 that is formed above a crystalline semiconductor region 204, wherein the conductive line element 202 and the semiconductor region 204 are separated from each other by an insulation layer 203. It should be emphasized that the conductive line element 202 may represent a gate electrode of a field effect transistor, as the formation of highly conformal sidewall spacers is particularly advantageous in laterally profiling a dopant concentration to be formed adjacent to the semiconductor region 204. However, the line element 202 may also represent any conductive line that may electrically connect various circuit elements or chip areas, thereby still providing the advantage of an improved stress behavior obtained by the provision of highly conformal sidewall spacers.

The semiconductor region 204 is formed in or on a substrate 201, which may be represented by a bulk semiconductor substrate, an insulating substrate having formed thereon a semiconductive material layer, and the like. It should be noted that the principles of the present invention may be applied to any type of semiconductor, although currently CMOS integrated circuits on the basis of silicon represent the major part of presently available integrated circuits. A spacer layer stack 220 is formed over the substrate 201 and may include a first etch stop layer 205, a first spacer layer 206, a second etch stop layer 215, and a second spacer layer 216. The first and second spacer layers 206, 216 are comprised of a material having a "similar" etch behavior when exposed to a predefined etch chemistry, wherein "similar" is to be understood to characterize etch rates of the first and second spacer layers with respect to the predefined etch chemistry that differ no more than approximately 100%. In one particular embodiment of the present invention, the first and second spacer layers 206, 216 may be comprised of silicon nitride, the characteristics of which are well-known and may be well-controlled during a corresponding deposition process. In other embodiments, the first and second spacer layers 206, 216 may be formed of other materials, such as silicon dioxide, if considered appropriate, or the first and second spacer layers 206, 216 may be comprised of different materials as long as a similar etch rate is obtained for a specified etch chemistry. The second etch stop layer 215 separating the first and second spacer layers 206, 216 may be comprised of a material exhibiting a sufficiently high etch selectivity with respect to the second spacer layer 216 so as to reliably stop an etch process or at least sufficiently slow down a corresponding etch process. In one particular embodiment, the second etch stop layer 215 may be comprised of silicon dioxide. The provision of a silicon dioxide etch stop layer 215 may be especially advantageous in combination with the first and second spacer layers 206, 216 comprised of silicon nitride, since well-approved etch recipes and etch chemistries are available from conventional silicon nitride spacer techniques.

In a further illustrative embodiment, the first etch stop layer 205 may be comprised of substantially the same material as the second etch stop layer 215, and may thus be, for instance, comprised of silicon dioxide.

A typical process flow for forming the semiconductor device 200 as shown in FIG. 2a may comprise the following processes. First, the insulation layer 203 and the conductive line element 202 may be formed by well-established oxidation and/or deposition techniques followed by advanced photolithography and etch processes. If the conductive line element 202 in combination with the insulation layer 203 is to represent a gate structure of a silicon-based field effect transistor, similar processes may be performed as previously described with reference to FIG. 1a, including corresponding processes for obtaining a vertical dopant profile in the region 204 and corresponding processes for forming isolation structures so as to electrically insulate the semiconductor device 200 from neighboring circuit elements. Thereafter, the spacer layer stack 220 is formed by a deposition sequence, such as a plasma enhanced CVD process sequence, in which the desired material composition of the individual layers and, to a certain degree, the physical characteristics thereof, may be adjusted by appropriately selecting the deposition parameters. In some embodiments, the first etch stop layer 205 may alternatively be formed by an oxidation process followed by respective CVD processes for forming the first spacer layer 206, the second etch stop layer 215, and the second spacer layer 216. As previously explained, in particular embodiments of the present invention, the spacer layer stack 220 may be comprised of silicon dioxide/silicon nitride/silicon dioxide/silicon nitride for the first etch stop layer 205, the first spacer layer 206, the second etch stop layer 215, and the second spacer layer 216, respectively. Corresponding deposition processes are well-established so that a thickness of the individual layers of the stack 220 may be controlled with high precision, as these thicknesses may, in some embodiments, substantially determine the dimensions of the conformal sidewall spacers that are finally obtained.

Figure 2B:
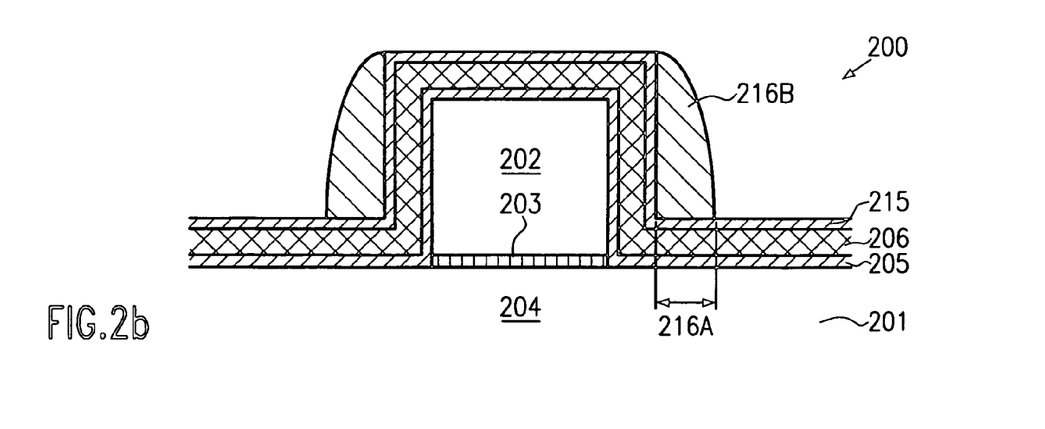

FIG. 2b schematically shows the semiconductor device 200 with substantial portions of the second spacer layer 216 removed so as to form sacrificial spacers 216b having a width 216a. The formation of the sacrificial spacers 216b is accomplished by an anisotropic etch process, wherein the specified etch chemistry is utilized, thereby providing an efficient etch rate for the material of the second spacer layer 216, while the etch process is reliably stopped on or within the second etch stop layer 215. For instance, when the second spacer layer 216 is comprised of PECVD silicon nitride, an etch chemistry on the basis of $CF_4$/HBr (carbon tetra fluoride/hydrogen bromide) may be used in a conventional reactive ion etch tool, wherein clearance of horizontal portions of the second etch stop layer 215 may be determined by an endpoint detection, as is well-established in conventional etch techniques. Thereafter, a short additional etch step, also referred to as "over-etch" step, may be performed based on a chemistry including $Cl_2$ (chlorine), HBr, $O_2$ (oxygen). As previously explained, a sufficiently high etch selectivity may be obtained with respect to the etch stop layer 215 during the main etch step and the subsequent over-etch step so as to precisely control the entire etch process for defining the sacrificial spacers 216b, wherein the width 216a is determined by the initial layer thickness of the second spacer layer 216, as is also explained with reference to FIG. 1b. In other embodiments, the thickness and/or the selectivity with respect to the predefined etch chemistry of the second etch stop layer 215, or the etch chemistry itself, may be controlled so as to remove at least substantial portions of the second etch stop layer 215, as will be described in more detail with reference to FIGS. 2f–2h.

Figure 2C:
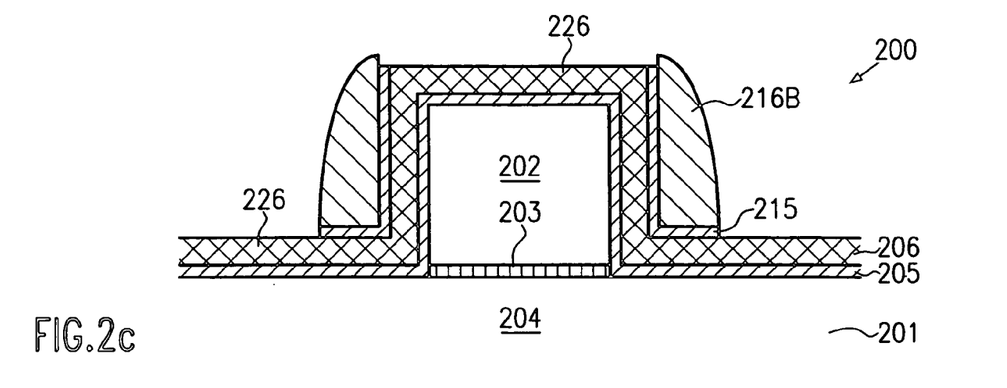

FIG. 2c schematically shows the semiconductor device 200 with substantial portions of the second etch stop layer 215 removed. To this end, the semiconductor device 200 may be exposed to an etch chemistry that efficiently removes material of the second etch stop layer 215, wherein, in particular embodiments of the present invention, well-established reactive gases may be used so as to offer a high degree of compatibility with conventional process recipes and etch tools. In one particular embodiment, when the second etch stop layer 215 is comprised of silicon dioxide, a well-established breakthrough etch step may be used so as to remove the horizontal portions of the second etch stop layer 215. For instance, a fluorine-containing plasma atmosphere may be established within the same process chamber as previously used for removing the material of the second spacer layer 216.

Thereafter, the sacrificial spacers 216b and exposed portions 226 of the first spacer layer 206 may be removed, which may be accomplished in one particular embodiment by a common isotropic etch process. Thereby, it is taken advantage of the fact that the etch behavior of the materials of the first and second spacer layers 206 and 216 are similar. For instance, if the first and second spacer layers 206, 216 are comprised of silicon nitride, an isotropic etch recipe on the basis of an $SF_6$ chemistry may be used to remove the sacrificial spacers 216b and the exposed portions 226.

In another embodiment (not shown), the second spacer layer 216 is anisotropically etched and a breakthrough etch of the second etch stop layer 215 is performed, thereby forming the sacrificial spacer 216b. Then, the first spacer layer 206 is anisotropically etched, wherein these etch processes may be performed in a single etch chamber to create a D-shaped spacer comprised of, for instance, oxide and nitride. Next, all the implants are performed and, prior to silicidation, the sacrificial spacer 216b is removed with an isotropic etch or anisotropic etch. The degree of isotropy determines the loss of spacer width 206L, which allows use of a smaller spacer width for a subsequent silicidation in comparison to the implants. This process flow may be used if an L-shaped spacer is considered beneficial for silicidation in terms of higher spacer recess, thereby providing an additional degree of freedom for CoSi (cobalt silicide).

Figure 2D:
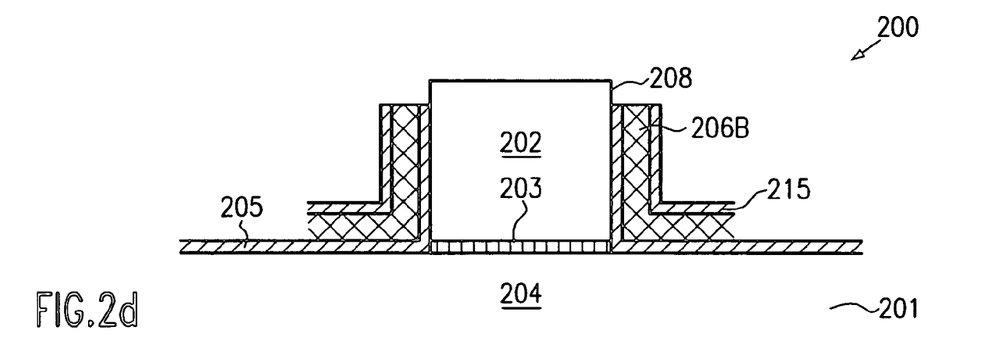

FIG. 2d schematically shows the semiconductor device 200 after the above-described removal of the sacrificial spacer 216b and the exposed portions 226, thereby defining a conformal or L-shaped spacer element 206b. In some embodiments of the present invention, it may be considered appropriate to use the conformal spacer 206b with portions of the second etch stop layer 215 still located thereon and with the first etch stop layer 205 still covering the substrate 201 and the conductive line element 202. For instance, if an ion implantation sequence is to be performed so as to laterally define a dopant profile adjacent to the region 204, the "screening" effect of the layers 205, 215 may be advantageously exploited and the implantation parameters may be selected so as to take into consideration the "extra" thickness of the layers 205 and 215 compared to a completely cleared substrate surface.

In other embodiments, after substantially removing the sacrificial spacer 216b, thereby also exposing the horizontal surface portions of the device 200, an additional over-etch step may be performed so as to controllably expose upper sidewall portions 208 of the conductive line element 202, wherein these portions are still covered by the first etch stop layer 205. To this end, an over-etch step may be performed on the basis of a $Cl_2$/HBr/He—$O_2$ chemistry, which may be designed to have an increased anisotropic component. In this way, the height of the exposed sidewall portion 208 may be controlled by varying the etch time, while at the same time an adverse undercut at the foot of the conformal spacer 206b is substantially suppressed. Recessing the conformal spacer 206b may be advantageous for a subsequent silicidation process to enhance the conductivity of the line element 202 when it is provided as a polysilicon line, as is typical for conventional silicon-based CMOS technologies.

Figure 2E:
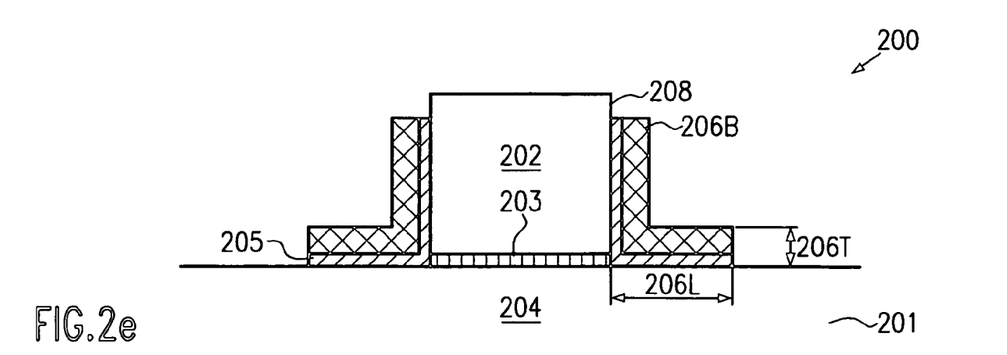

FIG. 2e schematically shows the semiconductor device 200 after removal of exposed portions of the first etch stop layer 205, thereby exposing horizontal portions of the substrate 201 and the conductive line element 202 as well as the upper sidewall portions 208. If the first etch stop layer 205 is comprised of silicon dioxide, an HF wet etch process may be performed. During this etch step, the remaining portions of the second etch stop layer 215 (see FIG. 2d) may also be removed so as to form the conformal spacer elements 206b having a thickness 206t that is determined by the initial thickness of the first spacer layer 206 and the initial thickness of the first etch stop layer 205. Similarly, a length of the conformal spacer 206b, denoted as 206l, is substantially determined by the thickness of the first etch stop layer 205, the first spacer layer 206, the thickness of the second etch stop layer 215, and by the width 216a (see FIG. 2b) of the sacrificial spacer 216b, i.e., by the initial thickness of the second spacer layer 206b. In addition to controlling the respective thicknesses of these layers, the length 206l may also be controlled by adjusting corresponding process parameters, such as the etch time, of the isotropic process for commonly removing the sacrificial spacer 216b and the exposed portions 226, as is explained with reference to FIG. 2c. The possibility of controlling the length 206l independently, at least to a certain degree, from the thickness 206t offers more flexibility in laterally shaping a dopant profile in subsequent implantation processes. For example, the implantation parameters, such as the implantation energy, may be selected so as to provide the peak dopant concentration below the horizontal foot portion of the spacer 206b at a desired first depth within the substrate 201, while the respective peak concentration in non-covered substrate portions is deposited correspondingly deeper at a second depth. Thus, the thickness 206t may be correspondingly adapted to obtain the desired vertical dopant distribution at these two different implantation depths, while at the same time the spacer length 206l may be controlled by the isotropic etch process so as to provide a desired lateral extension of the corresponding dopant concentrations at the first and second depths.

As a consequence, the illustrative embodiments described above enable the formation of a conformal, i.e., L-shaped, spacer, wherein well-established process recipes and/or reactive gases and/or etch tools may be utilized. In particular embodiments, the entire etch process flow may be performed in a single etch chamber, thereby optimizing tool utilization. Additionally, the total etch time may be in the same order of magnitude as for a conventional, standard, non-conformal spacer. Furthermore, the finally-obtained conformal spacers 206b exhibit a high degree of uniformity across the entire area of the substrate 201 even for 200 mm or 300 mm wafers, irrespective of whether dense line patterns or substantially isolated conductive lines are considered. Moreover, only negligible tendencies for damaging the conductive line element 202 and/or the substrate 201 are observed, thereby offering the possibility of providing extremely thin first and second etch stop layers 205, 215, for instance in the form of thin liner oxides. In this way, the final dimensions of the conformal spacer 206b are substantially determined by the first and second spacer layers, which may be deposited with high precision, especially if silicon nitride is used as the material of these spacer layers.

Figure 2F:
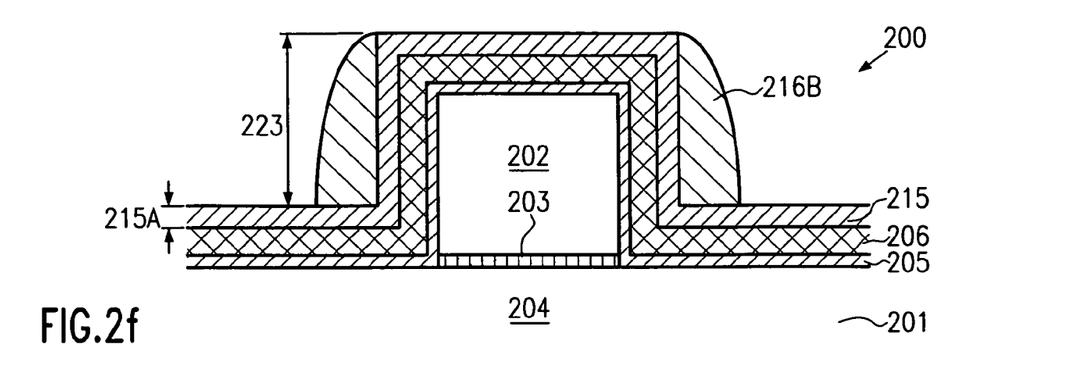
FIGS. 2f–2h schematically show further illustrative embodiments for forming conformal sidewall spacers in which sacrificial sidewall spacers are substantially removed by an anisotropic etch process.

With reference to FIGS. 2f–2h, further illustrative embodiments of the present invention will now be described in more detail. FIG. 2f schematically shows the semiconductor device 200 having a similar configuration as is described with reference to FIG. 2b. Thus, the semiconductor device 200 comprises the first and second etch stop layers 205, 215 and the first spacer layer 206, while the second spacer layer 216 is shown in a condition during an anisotropic etch process, where a significant portion of the second spacer layer 216 is already removed and only the sacrificial spacers 216b are present. In the embodiment shown, the second etch stop layer 215 may be comprised of a material exhibiting a specified etch selectivity with respect to the anisotropic etch chemistry used during the removal of the second spacer layer 216. Based on the predefined etch selectivity, a thickness 215a of the second etch stop layer 215 may be adapted to a height 223 of the sacrificial spacer 216b so that a substantial portion of the second etch stop layer 215 is also removed while the anisotropic etch process for forming the sacrificial spacer 216b is continued to also remove a substantial portion, or substantially all of the sacrificial spacer 216b, during the anisotropic etch process. For instance, if the second etch stop layer 215 is comprised of silicon dioxide exhibiting a moderately high etch selectivity in the range of approximately 8–10 with respect to silicon nitride, the thickness 215a is selected in the range of approximately 1–5 nm for a height 223 in the range of approximately 100–500 nm.

In other embodiments, the material composition of the second etch stop layer 215 may be correspondingly controlled during the plasma enhanced CVD process so as to adjust the etch selectivity to a desired degree. For example, during the deposition of the second etch stop layer 215 when substantially comprised of silicon dioxide, the amount of nitrogen incorporated into the silicon dioxide layer may be controlled so as to obtain the desired etch selectivity for a desired final thickness 215a. That is, for a given desired thickness 215a, the characteristics of the second etch stop layer 215 may be correspondingly adjusted during the deposition process so as to obtain a required etch selectivity in order to remove a desired portion of the second etch stop layer 215 during the anisotropic etch process. In one particular embodiment, the etch selectivity and/or the thickness 215a are selected so that substantially all of the exposed portions of the second etch stop layer 215 are removed during the anisotropic removal of the sacrificial spacers 216b.

Figure 2G:
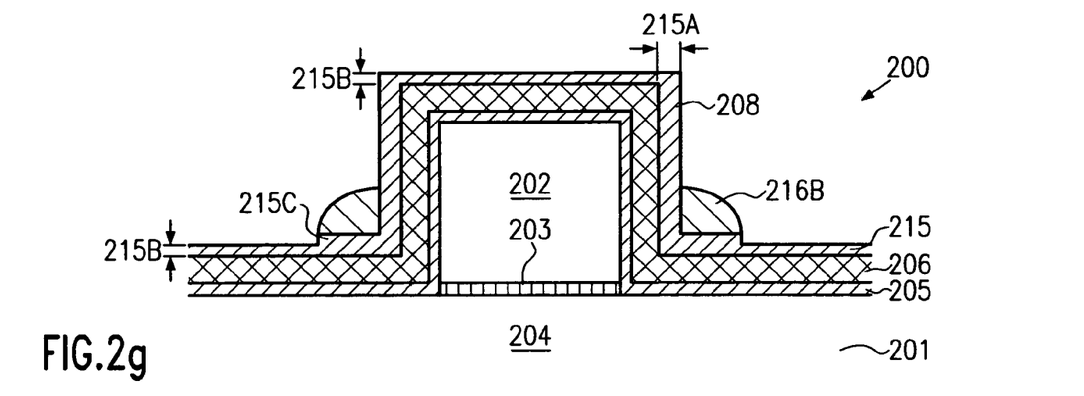

FIG. 2g schematically shows the device 200 during an advanced stage of the specified anisotropic etch process, wherein a substantial portion of the sacrificial spacer 216b is already removed and the second etch stop layer 215 having the adapted etch selectivity and/or initial thickness 215a exhibits a reduced thickness 215b at exposed portions. The anisotropic etch process may still be continued so as to substantially completely remove the sacrificial spacers 216b while still further thinning the second etch stop layer 215 at the exposed portions. During the further progression of the anisotropic etch process, the material removal below the removed sacrificial spacer 216b will slow down in conformity with the etch selectivity of the second etch stop layer 215, while the material removal process adjacent to the (removed) sacrificial spacers 216b now removes the material of the first spacer layer 206 at an elevated etch rate. Since typically the initial thickness of the first spacer layer 206 is significantly less than the height 223, the remaining portion 215c of the second etch stop layer 215 will reliably stop the anisotropic etch process after the exposed portions of the first spacer layer 206 are substantially completely removed.

Figure 2H:
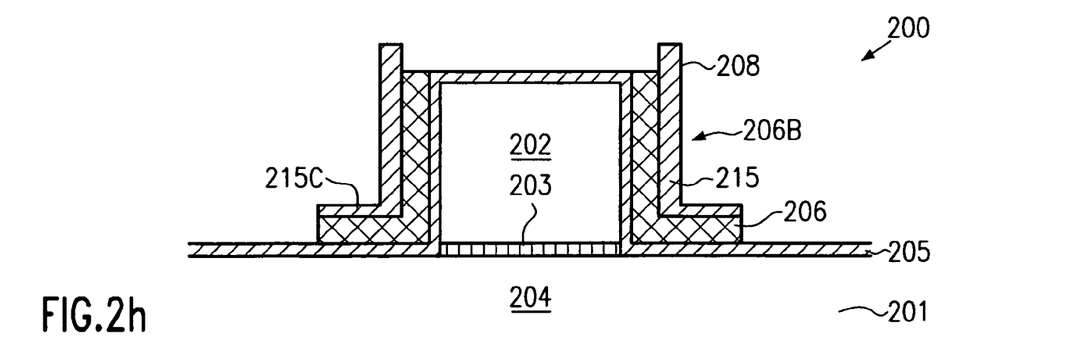

FIG. 2h schematically shows the device 200 after completion of the above-described anisotropic etch process, wherein the conformal spacers 206b are formed. As previously pointed out with reference to FIG. 2d, a corresponding over-etch step may be performed so as to substantially completely remove residues of the first spacer layer 206 from horizontal portions of the line element 202 and the substrate 201. Regarding the etch chemistry used for the anisotropic etch process, the same criteria apply as previously discussed. As is evident from FIGS. 2f–2h, a single etch chemistry and a single etch step may be sufficient to form and remove the sacrificial spacers 216b and define the conformal spacers 206b, thereby enhancing tool utilization and reducing process complexity. Although the above-described embodiments are particularly advantageous when the first and second spacer layers 206, 216 are comprised of substantially the same material, in other embodiments, it may be enough that these layers show a sufficiently similar etch behavior, wherein "sufficiently similar" is meant to describe the situation where the etch rates of the first and second spacer layers in a specified anisotropic etch process are both higher by a factor of at least 5 with respect to the etch rate of the first and second etch stop layers 205 and 215.

It should be noted that in other embodiments the sacrificial spacers 216b may not be completely removed during the specified anisotropic etch process, as is shown in FIG. 2g, wherein, in a subsequent breakthrough etch step, the exposed portions of the second etch stop layer 215 may efficiently be removed owing to the reduced thickness. In other embodiments, the etch stop layer 215 may be removed by a substantially isotropic etch recipe, as are well-established for silicon dioxide, so as to reliably remove the etch stop layer 215 from the sidewall portions 208, even though this portion exhibits an increased thickness 215a compared to the reduced thickness of the portion 215c (see FIG. 2g). Further processing may be resumed by anisotropically and/or isotropically removing the residual sacrificial spacer 216b and exposed portions of the first spacer layer 206 so as to form the conformal spacers 206b. During this etch procedure, the degree of recessing the first spacer layer 206 at the sidewall portions 208 may readily be controlled since the etch process is reliably stopped at or within the first etch stop layer 205, even though the exposed portions of the layer 206 are already substantially removed. In this way, an increased portion of the sidewalls of the conductive line element 202 may be exposed, for instance for a silicidation process, substantially without affecting the dimensions of the conformal spacer 206b, such as the spacer thickness 206t and the spacer length 206l.

Again, referring to FIG. 2h, after anisotropically removing the sacrificial spacers 216b and thereby forming the conformal spacers 206b, the anisotropic etch process may be continued so as to define a desired degree of recessing of residues of the first spacer layer 206, substantially without damaging the line element 202 and the substrate 201, which are still covered by the first etch stop layer 205. Thereafter, the residues of the second etch stop layer 215 may be removed to obtain the conformal spacer elements 206b as are shown in FIG. 2e. The removal of the residues of the second spacer layer 215 may be accomplished by, for instance, an isotropic etch process, wherein, when the first etch stop layer 205 is comprised of substantially the same material as the second etch stop layer 215, corresponding portions of the substrate 201 and the line 202 may be exposed. In this way, the number of different etch recipes for the formation of the conformal spacers 206b is minimized and may be highly compatible to conventional spacer formation techniques. In other embodiments, the etch chemistry for removing the first and second etch stop layers 205, 215 may be specifically designed for the materials used.

As a result, the present invention allows the formation of conformal, i.e., L-shaped, sidewall spacers, in that identical or similar materials are used for the sacrificial spacers and the conformal spacers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming spacer elements, the method comprising:
   forming a conductive line above a semiconductor region;
   conformally forming a spacer layer stack over said conductive line and said semiconductor region, said spacer layer stack comprising an etch stop layer separating a first spacer layer from a second spacer layer formed above said first spacer layer, said first and second spacer layers comprised of a material that may be etched selectively to said etch stop layer by a predefined etch chemistry;
   anisotropically etching said second spacer layer to form sacrificial sidewall spacers;
   removing portions of said etch stop layer that are exposed during the formation of said sacrificial sidewall spacers; and
   removing said sacrificial sidewall spacers and exposed portions of said first spacer layer by an etch process using said specified etch chemistry to form said spacer elements, wherein the steps of anisotropically etching said second spacer layer to form sacrificial sidewall spacers, removing portions of said etch stop layer that are exposed during the formation of said sacrificial sidewall spacers, and removing said sacrificial sidewall spacers and exposed portions of said first spacer layer by a common etch process using said specified etch chemistry are all performed in a single etch chamber as an in situ process.

2. The method of claim 1, further comprising forming a second etch stop layer under said spacer layer stack.

3. The method of claim 2, wherein said second etch stop layer is comprised of the same material as said etch stop layer.

4. The method of claim 3, further comprising removing exposed portions of said second etch stop layer.

5. The method of claim 1, wherein said sacrificial sidewall spacers and exposed portions of said first spacer layer are removed by an isotropic etch process.

6. The method of claim 1, wherein said first and second spacer layers are comprised of substantially the same material.

7. The method of claim 6, wherein said first and second spacer layers are comprised of silicon nitride.

8. The method of claim 7, wherein said first and second spacer layers are formed by plasma enhanced chemical vapor deposition.

9. The method of claim 7, wherein said etch stop layer is comprised of silicon dioxide.

10. The method of claim 2, wherein said second etch stop layer is comprised of silicon dioxide.

11. The method of claim 5, further comprising controlling a degree of recessing said first spacer layer with respect to a top surface of said conductive line by correspondingly adjusting at least one process parameter of the isotropic etch process.

12. The method of claim 11, wherein said at least one process parameter represents at least one of an etch chemistry and an etch time.

13. The method of claim 1, further comprising adjusting a length of said conformal spacer element by controlling a thickness of said second spacer layer.

14. The method of claim 1, further comprising adjusting a thickness of said conformal spacer element by controlling a thickness of said first spacer layer.

15. The method of claim 1, wherein said conductive line represents a gate electrode of a field effect transistor receiving a lateral drain and source dopant profile that is controllable by the thickness and the length of said conformal spacer element.

16. The method of claim 1, wherein said sacrificial sidewall spacers are removed, at least partially, by an anisotropic etch process.

17. The method of claim 16, further comprising selecting a thickness of said etch stop layer on the basis of a height of said line and an etch selectivity of said anisotropic etch process.

18. The method of claim 17, wherein said exposed portions of said etch stop layer are removed, at least partially, during said anisotropic etch process.

19. A method of forming spacer elements, the method comprising:
   forming a conductive line above a semiconductor region;
   forming a spacer layer stack comprising a first etch stop layer formed of a first material, a first spacer layer formed of a second material, a second etch stop layer formed of said first material and a second spacer layer formed of said second material;
   forming a sacrificial spacer at least from said second spacer layer; and
   forming spacer elements at least from said first spacer layer by removing said sacrificial spacer, wherein the steps of forming sacrificial sidewall spacers and forming said conformal spacer elements by removing said sacrificial sidewall spacers are all performed in a single etch chamber as an in situ etch process.

20. The method of claim 19, wherein said second material comprises silicon nitride.

21. The method of claim 19, wherein said first material comprises silicon dioxide.

22. The method of claim 20, wherein said second material is deposited by plasma enhanced chemical vapor deposition.

23. The method of claim 19, wherein said sacrificial spacers are removed, at least partially, by an anisotropic etch process.

24. The method of claim 23, wherein said sacrificial spacers are substantially completely removed by an anisotropic etch process.

25. The method of claim 19, further comprising removing exposed portions of said first and second etch stop layers.

26. The method of claim 19, wherein said sacrificial sidewall spacers and exposed portions of said first spacer layer are removed by an isotropic etch process.

27. The method of claim 26, further comprising controlling a degree of recessing said first spacer layer with respect to a top surface of said conductive line by correspondingly adjusting at least one process parameter of said isotropic etch process.

28. The method of claim 27, wherein said at least one process parameter represents at least one of an etch chemistry and an etch time.

29. The method of claim 19, further comprising adjusting a length of said conformal spacer element by controlling a thickness of said second spacer layer.

30. The method of claim 26, further comprising adjusting a length of said conformal spacer element by controlling at least one process parameter of said isotropic etch process.

31. The method of claim 19, further comprising adjusting a thickness of said conformal spacer element by controlling a thickness of said first spacer layer.

32. The method of claim 19, wherein said conductive line represents a gate electrode of a field effect transistor receiving a lateral drain and source dopant profile that is controllable by a thickness and a length of said conformal spacer element.

* * * * *